(12) United States Patent
Abraham et al.

(10) Patent No.: US 8,456,894 B2
(45) Date of Patent: Jun. 4, 2013

(54) NONCONTACT WRITING OF NANOMETER SCALE MAGNETIC BITS USING HEAT FLOW INDUCED SPIN TORQUE EFFECT

(75) Inventors: David W. Abraham, Croton, NY (US); Jonathan Z. Sun, Shrub Oak, NY (US); Guohan Hu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 160 days.

(21) Appl. No.: 13/100,026

(22) Filed: May 3, 2011

(65) Prior Publication Data
US 2012/0281460 A1 Nov. 8, 2012

(51) Int. Cl.
G11C 11/00 (2006.01)
G11C 11/14 (2006.01)
G11C 11/15 (2006.01)

(52) U.S. Cl.
USPC .............. 365/158; 365/171; 365/173

(58) Field of Classification Search
USPC .......................... 365/158, 171, 173
See application file for complete search history.

(56) References Cited

U.S. PATENT DOCUMENTS

| | | | |
|---|---|---|---|
| 5,640,343 A | 6/1997 | Gallagher et al. | |
| 5,966,012 A | 10/1999 | Parkin | |
| 6,259,586 B1 | 7/2001 | Gill | |
| 6,300,150 B1 | 10/2001 | Venkatasubramanian | |
| 6,545,896 B1 | 4/2003 | Munden et al. | |
| 6,650,513 B2 | 11/2003 | Fullerton et al. | |
| 6,724,674 B2 | 4/2004 | Abraham et al. | |
| 6,759,263 B2 | 7/2004 | Ying et al. | |
| 6,771,534 B2 * | 8/2004 | Stipe ............................. | 365/158 |
| 6,809,900 B2 | 10/2004 | Covington | |
| 6,819,586 B1 | 11/2004 | Anthony et al. | |
| 6,836,392 B2 | 12/2004 | Carey et al. | |
| 6,950,260 B2 | 9/2005 | Coffey et al. | |
| 6,977,838 B1 | 12/2005 | Tsang et al. | |
| 6,985,383 B2 | 1/2006 | Tang et al. | |
| 7,035,137 B2 | 4/2006 | Iwata et al. | |
| 7,154,771 B2 | 12/2006 | Braun | |
| 7,372,116 B2 | 5/2008 | Fullerton et al. | |
| 7,411,815 B2 | 8/2008 | Gogl | |
| 7,486,545 B2 | 2/2009 | Min et al. | |
| 7,593,278 B2 | 9/2009 | Hu et al. | |
| 7,602,000 B2 | 10/2009 | Sun et al. | |
| 7,606,065 B2 | 10/2009 | Fontana et al. | |
| 7,796,428 B2 | 9/2010 | Redon | |
| 8,054,677 B2 * | 11/2011 | Zhu ............................... | 365/158 |
| 8,064,246 B2 * | 11/2011 | Slonczewski ................. | 365/158 |
| 8,089,132 B2 * | 1/2012 | Zheng et al. .................. | 365/158 |
| 8,199,564 B2 * | 6/2012 | Zheng et al. .................. | 365/158 |
| 8,217,478 B2 * | 7/2012 | Lou et al. ..................... | 365/158 |

(Continued)

OTHER PUBLICATIONS

Fukushima, et al., "Peltier Effect in Sub-Micron-Size Metallic Junctions", Jpn. J. Appl. Phys., vol. 44, 2005, pp. L12-L14.

(Continued)

*Primary Examiner* — Trong Phan
(74) *Attorney, Agent, or Firm* — Cantor Colburn LLP; Vazken Alexanian

(57) ABSTRACT

A mechanism is provided for noncontact writing. Multiple magnetic islands are provided on a nonmagnetic layer. A reference layer is provided under the nonmagnetic layer. A spin-current is caused to write a state to a magnetic island of the multiple magnetic islands by moving a heat source to heat the magnetic island.

24 Claims, 8 Drawing Sheets

U.S. PATENT DOCUMENTS

| | | | |
|---|---|---|---|
| 8,223,532 B2* | 7/2012 | Wang et al. | 365/158 |
| 2002/0121094 A1 | 9/2002 | VanHoudt | |
| 2005/0117392 A1 | 6/2005 | Hayakawa et al. | |
| 2005/0167770 A1 | 8/2005 | Fukuzawa et al. | |
| 2006/0013039 A1 | 1/2006 | Braun et al. | |
| 2009/0051880 A1 | 2/2009 | Ito | |
| 2009/0052222 A1 | 2/2009 | Hu et al. | |
| 2009/0161422 A1 | 6/2009 | Zhu et al. | |
| 2009/0175110 A1 | 7/2009 | Zayets et al. | |
| 2010/0080047 A1 | 4/2010 | Liu et al. | |
| 2010/0091563 A1 | 4/2010 | Zheng et al. | |
| 2010/0110783 A1 | 5/2010 | Liu et al. | |
| 2010/0148167 A1 | 6/2010 | Whig et al. | |
| 2010/0208516 A1 | 8/2010 | Javerliac et al. | |
| 2010/0271870 A1 | 10/2010 | Zheng et al. | |
| 2011/0063758 A1 | 3/2011 | Wang et al. | |
| 2011/0146741 A1 | 6/2011 | Hida et al. | |

OTHER PUBLICATIONS

Lee, et al., "Increase of Temperature Due to Joule Heating During Current-Induced Magnetization Switching of an MgO-Based Magnetic Tunnel Junction", Appl. Phys. Lett., vol. 92, 2008, 233502.

Li, et al., "Characterization of Sputtered Barium Ferrite Thin Films on Silicon-Nitride-Coated Carbon Substrates", Materials Research Society Symposium Proceedings, vol. 341, 1994, pp. 59-64.

Ohta, et al., "Giant Thermoelectric Seeback Coefficient of a Two-Dimensional Electron Gas in SrTiO3", Nature Materials, vol. 6, 2007. pp. 129-134.

Slonczewski, et al., "Initiation of Spin-Transfer Torque by Thermal Transport from Magnons", Physical Review B, vol. 82, Issue 5, 2010, 054403; pp. 054403-1-11.

Sugihara, et al., "Giant Peltier Effect in a Submicron-Sized Cu-Ni/Au Junction with Nanometer-Scale Phase Separation", Appl. Phys. Express, vol. 3, 2010, 065204.

Sui, et al., "Barium Ferrite Thin-Film Recording Media", Journal of Magnetism and Magnetic Materials, vol. 155, Issues 1-3, Mar. 2, 1996, pp. 132-139.

Zhang, et al., "Thermoelectric Performance of Silicon Nanowires", Appl. Phys. Lett., vol. 94, 2009, 213108.

International Search Report; International Application No. PCT/US12/31938; International Filing Date: Apr. 3, 2012; Date of Mailing: Jun. 22, 2012; 5 pages.

Written Opinion of the International Searching Authority; International Application No. PCT/US12/31938; International Filing Date: Apr. 3, 2012; Date of Mailing: Jun. 22, 2012; 6 pages.

International Search Report; International Application No. PCT/US2012/029881; International Filing Date: Mar. 21, 2012; Date of Mailing: Jun. 8, 2012; 5 pages.

Written Opinion of the International Searching Authority; International Application No. PCT/US2012/029881; International Filing Date: Mar. 21, 2012; Date of Mailing: Jun. 8, 2012; 9 pages.

* cited by examiner

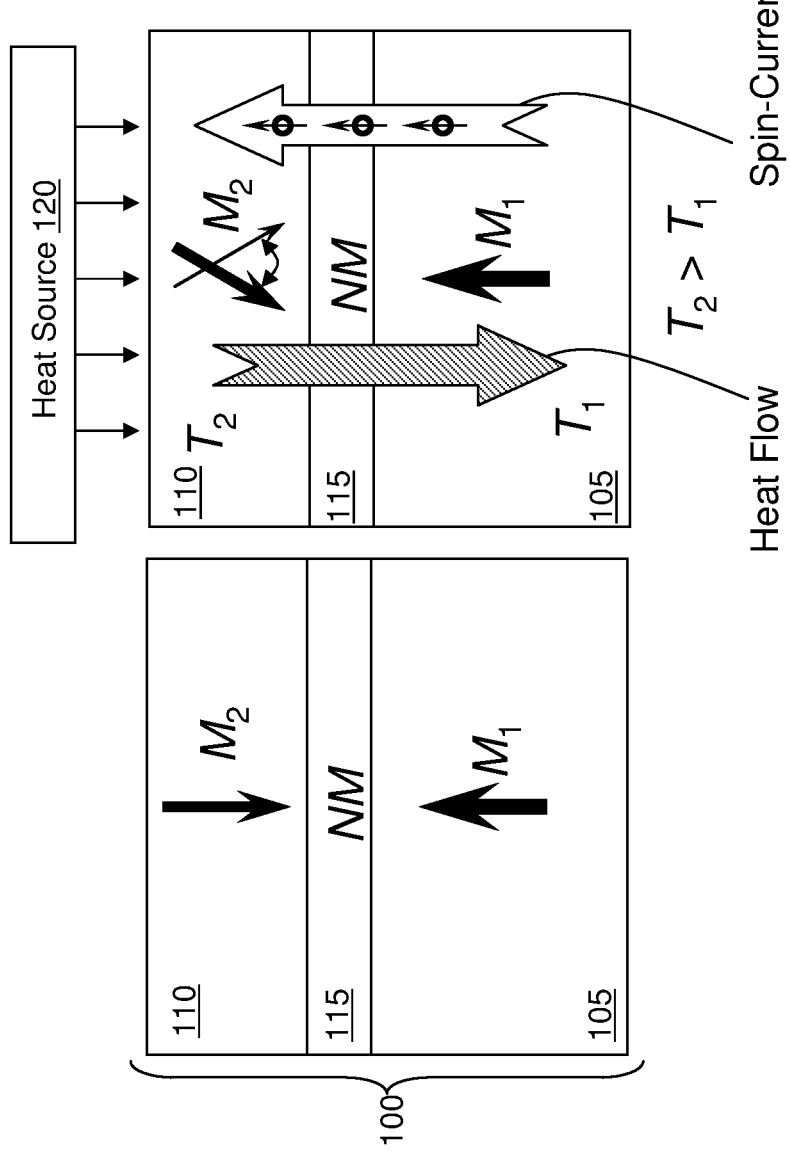

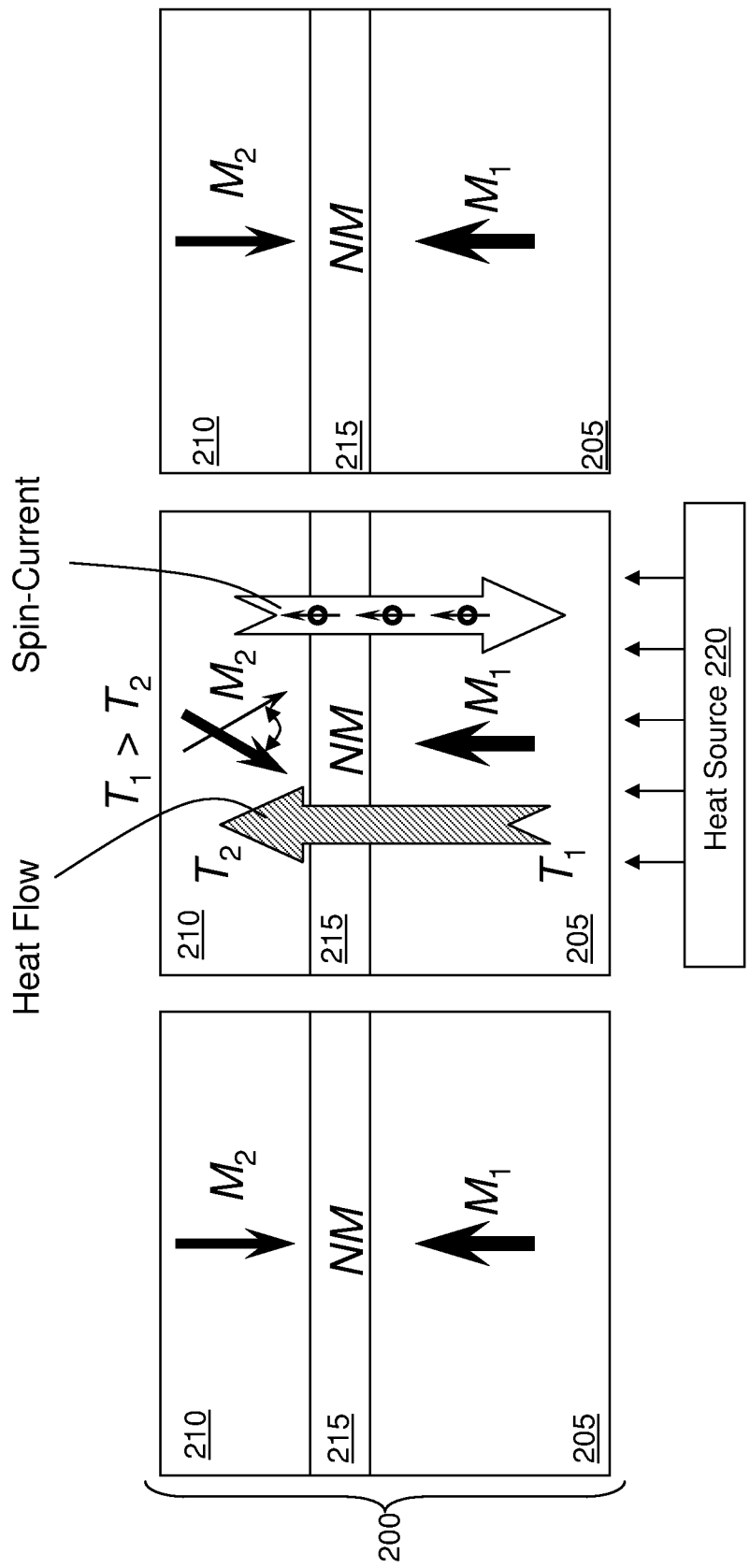

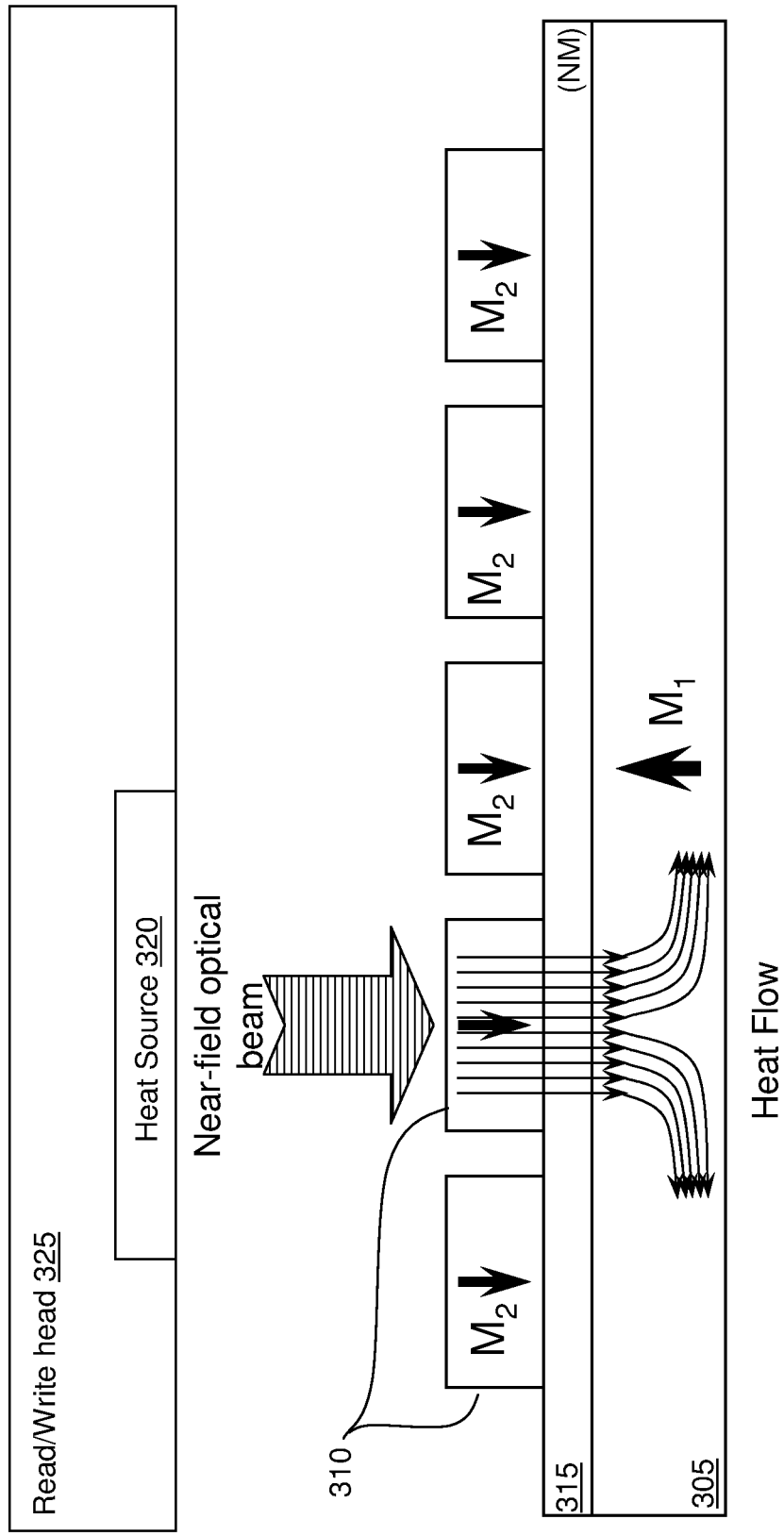

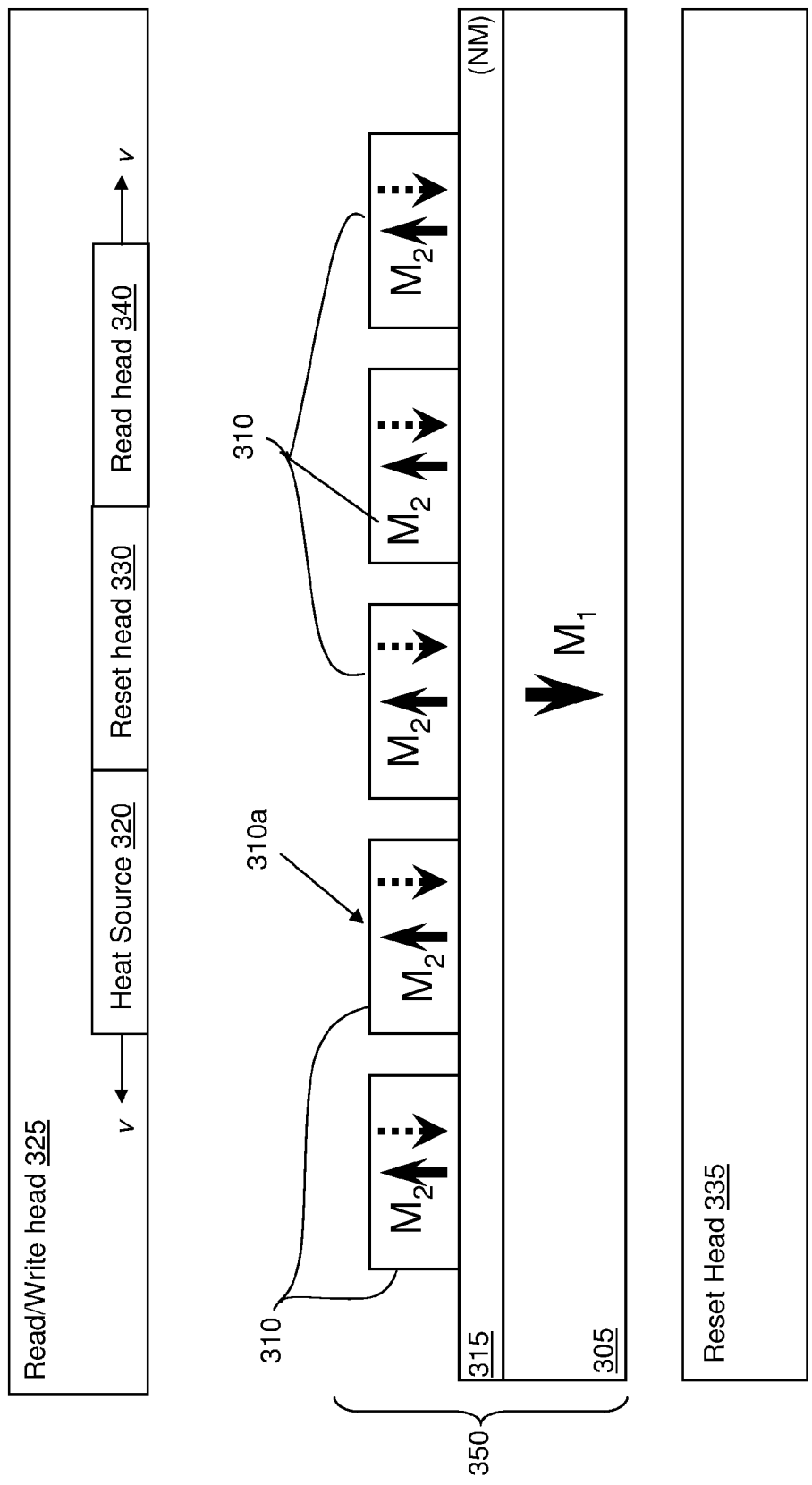

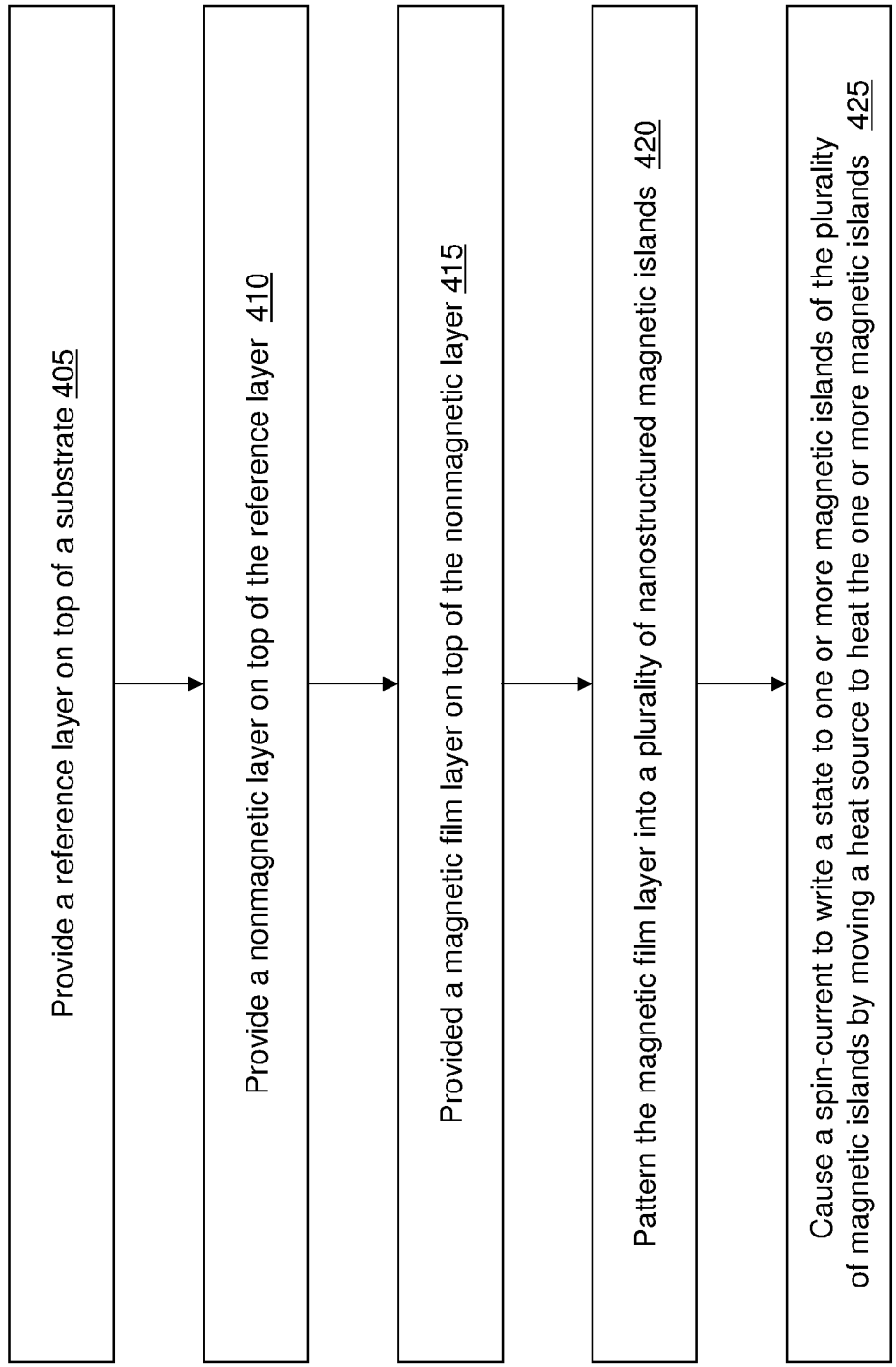

NONCONTACT WRITING OF NANOMETER SCALE MAGNETIC BITS USING HEAT FLOW INDUCED SPIN TORQUE EFFECT

BACKGROUND

Exemplary embodiments relate to memory, and more specifically, to noncontact writing using spin-currents.

Magnetoresistive random access memory is a non-volatile computer memory (NVRAM) technology. Unlike conventional RAM chip technologies, in MRAM data is not stored as electric charge or current flows, but by magnetic storage elements. The elements are formed from two ferromagnetic plates, each of which can hold a magnetic moment, separated by a thin insulating layer. One of the two plates is a reference magnet set to a particular polarity; the other's magnetic moment can be stabilized in different directions, each direction signifying a different state, serving a storage (memory) function, and is termed the "free magnet" or "free-layer". This configuration is known as a spin valve if the two magnetic layers are separated by a nonmagnetic metal spacer, and is known as a magnetic tunnel junction if the separation layer is an insulating tunnel barrier. This is the basic building block for a MRAM bit. A memory device is built from a grid of such "cells".

One method of reading is accomplished by measuring the electrical resistance of the cell. A particular cell is (typically) selected by powering an associated transistor which switches current from a supply line through the cell to ground. Due to the spin-dependent tunnel effect, the electrical resistance of the cell changes due to the change of relative orientation of the moments in the two plates. By measuring the junction resistance the magnetic state of the free layer can be determined. One may for the sake of consistency in discussions below define the two plates having the moment parallel configuration to mean "0", while if the two plates are of anti-parallel alignment to mean "1"; the resistance will be higher and this corresponds to "1". The same concept of using magnetic orientation to store digital information is the basis for today's magnetic hard-disk drive technology where the bits are stored by the magnetic moment orientations on the medium-plate, and a read/write head flies above the plate to access the bit state (i.e., read and write).

BRIEF SUMMARY

According to an exemplary embodiment, a method for noncontact writing is provided. Multiple magnetic islands are provided on a nonmagnetic spin-conducting layer. A magnetic reference layer is provided under the nonmagnetic layer. A spin-current is caused to write a state to a magnetic island of the multiple magnetic islands by moving a heat source to create a temperature gradient throughout the magnetic island and the reference layer, creating the spin current.

According to an exemplary embodiment, an apparatus for noncontact writing is provided. Multiple magnetic islands are on a nonmagnetic layer. A reference layer is under the nonmagnetic layer. A write head includes a heat source. The write head is configured to cause a spin-current to write a state to a magnetic island of the plurality of magnetic islands by moving the heat source to create a temperature gradient throughout the magnetic island and the reference layer.

According to an exemplary embodiment, a computer program product for noncontact writing is provided. The computer program produce includes a tangible storage medium readable by a processing circuit and storing instructions for execution by the processing circuit for performing a method. The method includes utilizing a multiple magnetic islands on a nonmagnetic layer and utilizing a reference layer under the nonmagnetic layer. Also, the method includes causing a spin-current to write a state to a magnetic island of the multiple magnetic islands by moving a heat source to create a temperature gradient throughout the magnetic island and the reference layer.

Additional features are realized through the techniques of the present disclosure. Other systems, methods, apparatus, and/or computer program products according to other embodiments are described in detail herein and are considered a part of the claimed invention. For a better understanding of exemplary embodiments and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features of the present disclosure are apparent from the following detailed description taken in conjunction with the accompanying drawings in which:

FIG. 1A illustrates a schematic of an initial state in accordance with an exemplary embodiment.

FIG. 1B illustrates a schematic for applying a heat source in accordance with an exemplary embodiment.

FIG. 1C illustrates a schematic of a changed state in accordance with an exemplary embodiment.

FIG. 2A illustrates a schematic of an initial state in accordance with an exemplary embodiment.

FIG. 2B illustrates a schematic for applying a heat source in accordance with an exemplary embodiment.

FIG. 2C illustrates a schematic of a changed state in accordance with an exemplary embodiment.

FIG. 3A illustrates a schematic for applying a heat source in accordance with an exemplary embodiment.

FIG. 3D illustrates a schematic for implementing a reset in accordance with an exemplary embodiment.

FIG. 4 illustrates a flow chart in accordance with an exemplary embodiment.

DETAILED DESCRIPTION

Figure 3B:
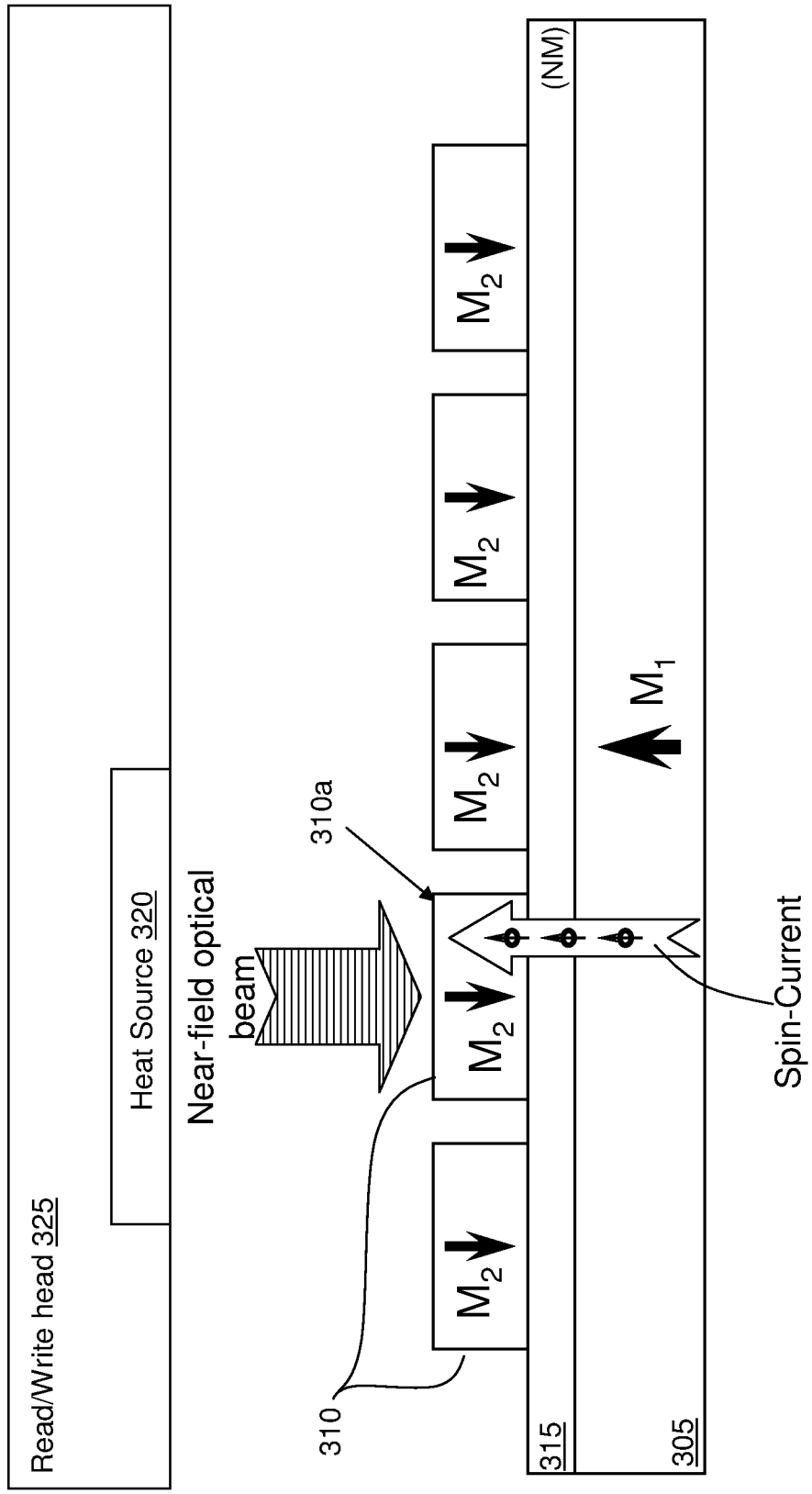
FIG. 3B illustrates a schematic for generating spin-current in accordance with an exemplary embodiment.

Data is written to the cells using a variety of means. In the simplest, the magnetic moments of the free layer can be re-directed by an applied magnetic field which can be generated by passing currents to wires adjacent to the memory bit, or by a current-controlled magnetic write head. As technologies advance, bit density increases, and a progressively larger and larger magnetic field is required to write the magnetic states for a bit of diminishing magnetic volume. In such cases, a more suitable mechanism for writing is sought. For smaller size bits (below, e.g., about 100 nm) a direct current injection passing through the magnetic tunnel junction could be used to switch the free layer's bit state via the so-called spin-torque induced magnetic switching which is different from magnetic field-induced switching. The spin-torque switching mechanism scales better for small bit sizes than using magnetic fields. However, in the normal implementations of the spin-torque switching, a charge current needs to be passed through the magnetic memory bit structure, and hence a direct electrical contact to the magnetic bit is required. This makes it difficult to implement such a write method in a magnetic hard-disk situation where the storage media containing the bit elements travels adjacent to the read/write head, and the storage media is normally not in physical contact with the read/write head.

Recent progress in spintronics research has pointed to the possibility of generating spin-currents via heat-current and not electrical charge-current. This way, it becomes possible to utilize the above mentioned spin-torque induced magnetic switching via heat-current which may not require direct electrical contact to the storage bits. As such, this opens up possibilities for spin-torque writing of bits residing on a magnetic hard-disk medium as well as for solid-state integrated magnetic memories (MRAM).

Since the magnetic field required to write a small magnetic bit increases with the reduction of the bit size, magnetic storage technologies in either hard-disk drive (HDD) or magnetic random access memory (MRAM) are pushing against physical limits for magnetic fields available to write a magnetic bit with ever-diminishing size. Spin torque provides an alternative to magnetic field induced writes. State of the art spin-torque-based writes depend on a charge current to generate the spin-current for write-operation. The use of spin-current avoids the limitations of magnetic field-based write, extending the scaling prospects of memory bits. A spin torque-induced write operation has been heavily explored for extending the scaling of MRAM but has not particularly been available for HDD storage technologies. This is in large part because the spin-torque used to date needs to be generated by a sizable electrical current, requiring electrical, and hence physical contact to the bits being written during the write operation. According to exemplary embodiments, it would be beneficial to utilize a noncontact approach for generating and utilizing spin-current and spin-torque, for the manipulation and writing of nanomagnet bits.

Recent state of the art theoretical work predicted that a sizable spin-current can be generated using thermal magnons via a thermal gradient in particular geometries. Using this mechanism, exemplary embodiments create a noncontact-based spin-torque writer suitable for hard disk drive technologies, making the potential benefits of spin-torque write over magnetic field write fully exploitable by the HDD industry. Further details of the approach to generate and use such noncontact spin-torque for writing magnetic bits are provided below, according to exemplary embodiments.

Now turning to FIGS. 1A, 1B, and 1C collectively referred to as FIG. 1, FIG. 1 illustrates a structure 100 according to exemplary embodiments.

In FIG. 1, the structure 100 is a three-layer structure comprising a reference layer (RL) 105 with magnetic moment M1, a free layer (FL) 110 with magnetic moment M2, and a nonmagnetic conductor layer (NM) 115. The nonmagnetic conductor layer 115 can for example be a high conductivity metal with a long spin-diffusion length. The free layer 110 and the reference layer 105 may be made from ferromagnetic materials such as Fe, Co, and/or for M1 especially insulating ferromagnets such as ferrites for the sake of maximizing magnon's contribution to thermal conductivity.

In FIG. 1A, the initial state has the moments M1 and M2 in opposite directions, where each resides in its own uniaxial energy potentials, with M1 in a deeper potential well than M2. The magnetic moment M may also be referred to as the magnetization of a layer. Accordingly, the moment M1 (or magnetization of the reference layer 105) is antiparallel to the moment M2 (or magnetization of the free layer 110).

In FIG. 1B, a heat source 120 is applied to the free layer 110 to cause a temperature gradient across the structure 100. The heat source may be a heat pulse from a laser. The temperature gradient is established across the free layer 110, the nonmagnetic layer 115, and the reference layer 105, with temperatures T2>T1; the temperature gradient induces a heat flow (shown by the heat flow arrow) that is accompanied by a spin-current flow (shown by the spin-current arrow). The spin-current excites the moment M2 in the free layer 110 via a spin-current-induced torque (spin-torque) and eventually reverses the moment M2 orientation.

In FIG. 1C, the end state of the moment M2 after the removal of the temperature gradient results in the moment M2 being aligned with the moment M1. Particularly, the moment M2 (or magnetization of the free layer 211) is now parallel to the moment M1 (or magnetization of the reference layer 105).

Referring to FIGS. 2A, 2B, and 2C collectively referred to as FIG. 2, FIG. 2 illustrates a structure 200 (which is identical to the structure 100) according to exemplary embodiments. In FIG. 2, the process is similar to FIG. 1 with an inverted heat flow, resulting in a final state with no change in the moment M2.

In FIG. 2, the structure 200 is a three-layer structure comprising a reference layer (RL) 205 with magnetic moment M1, a free layer (FL) 210 with magnetic moment M2, and a nonmagnetic conductor layer (NM) 215. The nonmagnetic conductor layer 215 can be a high conductivity metal with a long spin-diffusion length.

In FIG. 2A, the initial state has the moments M1 and M2 in opposite directions, where each resides in its own uniaxial energy potentials, with the moment M1 in a deeper potential well than the moment M2.

In FIG. 2B, a heat source 220 is applied to the reference layer 205 to cause a temperature gradient across the structure 200 opposite to the heat flow direction shown in FIG. 1. In FIG. 2B, the temperature gradient is established across the reference layer 205, the nonmagnetic layer 215, and the free layer 210, with temperatures T1>T2; the temperature gradient induces a heat flow (shown by the heat flow arrow) that is accompanied by a spin-current flow (shown by the spin-current arrow). If the reference layer 205 contains much more magnetic moment (for example M1 could be laterally more extended than M2, or M1 could be much thicker than M2, . . . etc) and is situated in a deep magnetic anisotropy potential (such as an uniaxial anisotropy potential), the spin-current induced in the free layer 200 will not be sufficient to switch (i.e., flip) the moment M1 in the reference layer 205 via spin-current-induced torque (spin-torque) and thus cannot reverse the M1 orientation. Unlike FIG. 1, the spin-current is in the opposite direction and consequently does not switch M2 in FIG. 2. Note that although the spin-current induced in structure 200 cannot flip the moment M1 orientation in the reference layer 205, the reference layer 205 may still be switchable with the application of a moderate amount of magnetic field. This is because M1 could be designed to contain more total magnetic moment. That way its coupling to magnetic field would be stronger, and a moderate amount of magnetic field would be sufficient to overcome a relatively large energy barrier for M1 to switch. This differentiation of spin-torque switching and magnetic field switching (the former being very effective for small magnets with sufficient energy barrier to be thermally stable, and the later effective for larger magnets with similarly or more thermally stable energy barrier) enables one to selectively switch M2 with spin current, while M1 with magnetic field, as is further discussed in FIG. 3.

In FIG. 2C, the end state of the moment M2 after the removal of the temperature gradient results in the moment M2 being the same with no state change. Accordingly, the moment M2 (or magnetization of the free layer 211) is still antiparallel to the moment M1 (or magnetization of the reference layer 105).

Figure 3C:
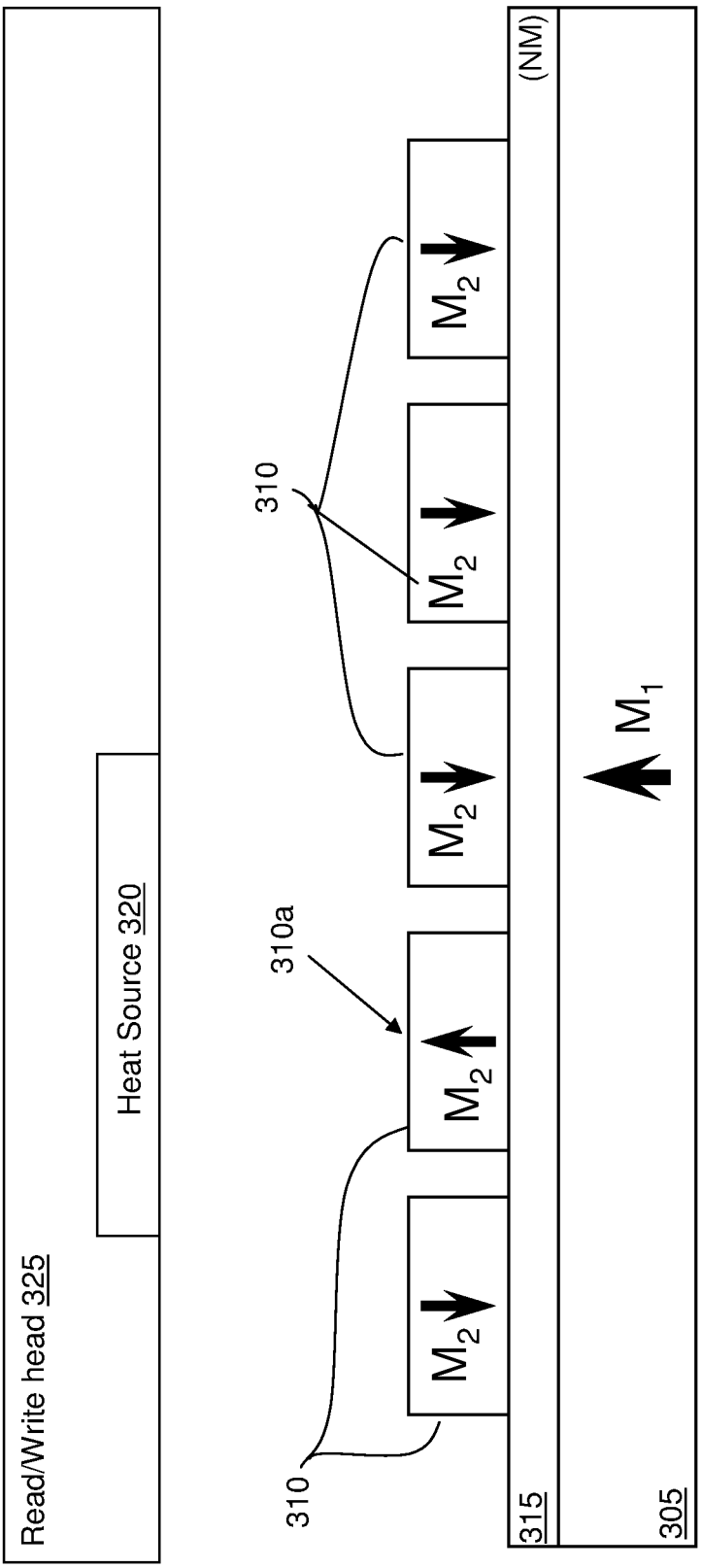
FIG. 3C illustrates a schematic of a changed state in accordance with an exemplary embodiment.

Now turning to FIGS. 3A, 3B, 3C, and 3D which may be collectively referred to as FIG. 3, FIG. 3 illustrates a schematic 300 for heat induced writing of patterned bits.

In FIG. 3, the schematic 300 shows a device comprising numerous structures shown in FIGS. 1 and 2.

A plurality of magnetic islands 310 are formed on top of a nonmagnetic conductor layer 315, which is on top of a reference layer 305. The magnetic islands 310 are free layers like free layers 110, 210. Being a free layer, the moment M2 in each magnetic island 310 is switchable between up and/or down orientation by the said spin-current. As discussed herein, the moment M is also called the magnetization, and initially, the magnetization orientation (i.e., the arrows) in each magnetic island 310 is antiparallel to the magnetization of the reference layer 305 as shown in FIG. 3A.

In accordance with exemplary embodiments, the magnetic islands 310 are each a magnetic bit in which the orientation of the moment M2 in each magnetic island 310 either corresponds to a 1 or 0. Accordingly, each magnetic bit is a 1 or 0. To provide a reference for explanation purposes, a down orientation of the moment M2 (i.e., magnetization) is a magnetic bit 1 (which is anti-parallel to moment M1) and an up orientation of the moment M2 is a magnetic bit 0 (which is parallel to moment M1). Each magnetic island 310 may also be referred to as a cell in an MRAM device, and/or a patterned bit in a so-called "patterned media" magnetic hard-disk; if for MRAM, the device comprises an array of magnetic islands 310 that function as discussed herein for storing information (ones and zeros) and the magnetic islands 310 need to be individually addressable. If for hard-disk, the bit element's (e.g., magnetic island 310) magnetic state can be read out via a read head similar to a conventional magnetic disk-drive. For either hard-drive or MRAM applications, the magnetic islands 310 do not necessarily need to be physically patterned structures but could be originating from the magnetic domains of a thin and continuous free layer magnetic film. For example, the magnetic islands 310 can be physically separated islands, and/or the magnetic island 310 could be magnetic domains inside a continuous magnetic film with the magnetic domains suitable for sustaining a distinct and stable magnetic state (i.e., 1 or 0).

In FIG. 3, the nonmagnetic conductor layer 315 corresponds to nonmagnetic conductor layers 115, 215. The nonmagnetic conductor layer 315 can be a high conductivity metal with a long spin-diffusion length, such as, e.g., copper, and the nonmagnetic conductor layer 315 conducts both heat and spin-current as discussed herein.

The reference layer 305 corresponds to reference layers 105, 205, and the reference layer 305 is a large structure that can be electrically insulating for best thermal magnon spin-current efficiency. Each of the magnetic islands 310 is initially antiparallel (in opposite direction) to the moment M1 of the reference layer 305. The magnetic moments M1 and M2 each reside in its own uniaxial energy potentials, with M1 in a deeper potential well than M2.

In the state of the art, to flip the moments M2 (magnetic bits which are very small in lateral size <<100 nm across, for example) from 1 to 0 or vice versa, a large magnetic field is required. However, because of the larger total magnetic moment in M1 and its extended volume (i.e., physical size), to flip the moment M1 of the reference layer 305, a relatively small magnetic field is required.

For explanation purposes, one magnetic island 310 may be identified as 310a (where the magnetic islands 310a-n are a total of magnetic islands and n is the last magnetic island 310). In FIG. 3A, a heat source 320 is applied to the magnetic island 310 to cause a temperature gradient across the device. The heat source 320 corresponds to the heat sources 120, 220. The temperature gradient is established across the magnetic island 310a (i.e., free layer), the nonmagnetic layer 315, and the reference layer 305, with the temperature T2 of the magnetic island 310a being greater than the temperature T1 of the reference layer 305.

In FIGS. 3A and 3B, the heat flow is created using a near-field optical beam of the read/write head 325. The heat source 320 such as a laser creates the near-field optical beam. The temperature gradient induces a heat flow shown by the heat flow arrows in FIG. 3A that are accompanied by a spin-current flow as shown by the spin-current arrow in FIG. 3B. The spin-current induced in layers 305-310a excites the moment M2 in the magnetic island 310a via a spin-current-induced torque (spin-torque) and eventually reverses the moment M2 orientation of the magnetic island 310a as shown in FIG. 3C.

In FIG. 3C, the spin-torque associated with the heat flow induces a flip of the magnetic bit being irradiated which can be any magnetic island 310, and thus accomplishes a bit write operation. In FIG. 3C, the magnetic island 310a now has its moment M2 parallel to the moment M1 of the reference layer 315. In this example, the magnetic bit of the magnetic island 310a is 0 while the remaining magnetic islands 310 have a magnetic bit of 1. As such, the heat source 320 can reside on a hard-disk's read/write head assembly (such as read/write head 325) and be controllably turned on and off while travelling horizontally across the media plate composed of layers 305-310; thus any of the magnetic islands 310 can be irradiated by the heat source 320 to flip the state of their moments M2 while the non-irradiated magnetic islands 310 keep their same state.

In accordance with exemplary embodiments, each of the magnetic islands 310 can have its moment M2 flipped to be parallel to the moment M1 of the reference layer 305. When the moments M2 and moment M1 are parallel (i.e., both pointed in the same direction) and the near-field optical beam of the heat source 320 irradiates, e.g., the magnetic island 310a, the moment M2 of the magnetic island 310a will not change because the spin-current (induced from the reference layer 305 by the given direction of the thermal gradient) can (only) cause the moment M2 to change to the same direction as the moment M1. In other words, the spin-current from the reference layer 305 changes the orientation of the moment M2 (only) when the moment M2 has an opposite orientation than the moment M1 but the spin-current does not change the moment M2 when M2 is the same as the moment M1.

FIG. 3D illustrates a reset head 330 and a read head 340 in the schematic 300 according to exemplary embodiments. The heat source 320, the reset head 330, and the read head 340 may be carried by the read/write head assembly (i.e., read/write head 325), and move with a velocity (v) in any direction with respect to the storage media platter 350 (i.e., storage media element). Although one heat source 320, one reset head 330, and one read head 340 are illustrated, it is contemplated that in one implementation there may be a plurality of heat sources 320, plurality of reset heads 330, and/or plurality of read heads 340 in the read/write head 325, and/or multiple read/write head assemblies (i.e., multiple read/write heads 325), each covering a designated area over the storage media platter 350.

In one implementation, there may be a heat source 320 (and/or a read head 330) corresponding to each magnetic island 310, such that each magnetic island 310 has its own heat source 320 (and/or read head 330). For example, if there is an array of magnetic islands 310, there is a corresponding array of heat sources 320 (and/or read heads) configured to heat its respective magnetic island 310 as discussed herein. In another implementation, there may be multiple read/write heads 325 each comprising the heat source 320, the reset head 330, and/or read head 340, and the multiple read/write heads 325 correspond to each of the magnetic islands. It is understood that the various implementations are for illustrative purposes and are not meant to be limiting. It is contemplated that further implementations may be considered in accordance with the present disclosure.

The reference layer 305 is a base ferromagnetic layer in which the ferromagnetic layer is extended (i.e., unpatterned); therefore, the reference layer 305 can be reversed by a moderate amount of magnetic field provided by the reset head 330. The reset head 330 can reside on the same side of the storage media platter 350 inside the read/write head assembly 325, and/or it can be a separate structure residing elsewhere, for example residing on the other side of the storage media platter 350.

In the case in which the moments M2 and M1 are parallel (corresponding to a 0) with an up orientation, the reset head 330 can apply a small magnetic field to reverse (reset) the orientation of the moment M1 of the reference layer 305 such that the moment M1 is antiparallel (pointing down) to the moments M2 in the magnetic islands 310 (which are now pointing up in FIG. 3D as shown by the dark arrow). Accordingly, a near-field optical beam (not shown in FIG. 3D to avoid obscuring the figure) can then be irradiated on each and/or any of the magnetic islands 310 causing a heat flow/ temperature gradient (in the direction of the reference layer 305) which generates a spin-current (from the reference layer 305 into the magnetic islands 310) to change their respective moments M2. The spin-current arrow (like that in FIG. 3B) is not shown in FIG. 3D, so as not to obscure the figure. Since the spin-current is flowing in the reference layer 305 than has the moment M1 in the opposite direction of the moments M2, the spin-current will flip the moments M2 to align with the direction of the moment M1. The arrows with the dashed lines pointing down illustrate how the moments M2 have now flipped their orientation to again be parallel to the moment M1. Accordingly, the reset head 330 can apply a magnetic field to change (reset) the orientation of the moment M1, such that the moment M1 would be antiparallel to the moments M2, and the writing process can continue.

FIG. 3D also illustrates a reset head 335 which is configured to operate as a global reset head. As mentioned above, the reset head 330 is configured to (only) reverse the direction of moment M1 in the reference layer 305 without necessarily being able to reverse the moments M2 in the magnetic islands 310 (because M2 requires a much higher magnetic field to flip and the reset head 330 may not generate a high enough magnetic field). However, the reset head 335 is configured with a higher magnetic field for performing a global reset for simultaneously resetting both the moment M1 in the reference layer 305 and the moments M2 in the magnetic islands 310. Particularly, the global reset by the reset head 335 can be configured to, e.g., flip the magnetization (i.e., M1) of the reference layer 305 at the same time as flipping the magnetization (i.e., M2) of all magnetic islands 310 and/or at the same time as flipping the magnetization (M2) of a group of magnetic islands 310. The global reset could be configured to flip both moments M1 and M2 to be the opposite direction of their present direction, to flip both moments M1 and M2 to be parallel (i.e., the same direction) to one another, and/or to flip both moments M1 and M2 to be antiparallel (i.e., the opposite direction) to one another. Since the reset head 335 is configured to wipe the slate clean (e.g., reset both M1 and M2), there is no requirement to have a very fine spatial resolution in applying the reset magnetic field. It could in some cases be easier to generate large magnetic fields (via the reset head 335) over a certain area of the media disk (which comprises the reference layer 305, the nonmagnetic conductor layer 315, and the magnetic islands 310) as opposed to a large magnetic field in a very small confined space such as a single (bit M2) magnetic island 310.

Note that although FIG. 3 illustrates examples of writing the magnetization (moment M2) of the magnetic islands 310 to be parallel to the magnetization of the reference layer 305, exemplary embodiments are not limited to such as case. Exemplary embodiments can also write the magnetization of the magnetic islands 310 to be antiparallel to the magnetization of the reference layer 305.

For example, appropriate materials may be selected for the magnetic islands 310 so that the heat source 320 can write the (moment M2 in the) magnetic islands 310 to an antiparallel direction with respect to the reference moment M1, while utilizing the same heat direction and spin-current direction discussed herein for FIG. 3. Examples of materials for writing the magnetic islands 310 antiparallel to the reference layer 305 include but are not limited to rare-earth-containing ferromagnets near compensation point, such as TbFeCo, or GdCo for example as M2, and an YIG or other ferrite magnet for M1. Also, examples of materials for writing the magnetic islands 310 parallel to the reference layer 305 include but are not limited to a thin CoCrPt or Co/Pt multilayer for M2 and the same YIG or other ferrite magnet for M1.

FIG. 1 shows how the heat flow generates spin-current to flip the moment M2 to be parallel to the moment M1, but reversing the heat flow as in FIG. 2 does not flip the moment M2. However, FIG. 3 shows how the moment M2 can be flipped in both directions (up or down) as desired. FIG. 3 also shows how the moment M1 and/or moment M2 can be reset.

FIG. 4 illustrates a flow chart 400 for a method for constructing a noncontact writing device according to exemplary embodiments. Reference can be made to FIGS. 1, 2, and 3 as discussed herein.

A reference film layer (such as reference layer 105, 205, 305) is provided on top of a substrate (e.g., silicon) at operation 405. The reference film layer is a magnetic layer.

A nonmagnetic film layer (such as nonmagnetic layer 115, 215, 315) is provided on top of the reference layer at operation 410.

A magnetic film layer (which is used to make the magnetic islands) is provided on top of the nonmagnetic film layer at operation 415.

If necessary, the magnetic film layer is patterned into nanostructured magnetic islands (such as magnetic islands 110, 210, 310) at operation 420.

A spin-current (illustrated as the spin-current arrow in FIG. 3B) is caused/induced to write a state to a magnetic island (e.g., such as magnetic island 310a) of the plurality of magnetic islands by moving a heat source (such as heat source 120, 220, 320) to heat the magnetic island at operation 425.

Additionally, heating the magnetic island to cause a thermal gradient (illustrated as the heat flow arrow) across the magnetic island 310, the nonmagnetic layer 315, and the reference layer 305 (as shown in FIGS. 1, 2, and 3) in turn causes the spin-current to write the state to the magnetic island of the plurality of magnetic islands. The spin-current writes the state of the magnetic island to be parallel to the reference layer as shown in FIGS. 1 and 3. When heat is applied, the temperature of the magnetic island 310 is greater than the temperature of the reference layer 305. The state of the magnetic island is a one or zero and the magnetic island is a magnetic bit.

The magnetic island has a first moment (such as moment M2 also referred to as a magnetization) and the reference layer has a second moment (such as moment M1). From an antiparallel orientation, the spin-current induced in the reference layer causes the first moment to be parallel to the second moment, and the first moment corresponds to the state (e.g., 0 or 1) of the magnetic island.

When a plurality of moments (such as moments M2) of the plurality magnetic islands 310 are written to be parallel to the moment (such as moment M1) of the reference layer 305, the reset head 330 is configured to flip (reset) the moment M1 of the reference layer 305 to be antiparallel (opposite direction) to the plurality of moments M1 of the plurality of magnetic islands 310. The reset head 330 generates a magnetic field that flips the moment M1 of the reference layer 305. The magnitude of the magnetic field that flips the moment M1 of the reference layer 305 is not necessarily high/strong enough to flip any of the plurality of moments M2 of the plurality of magnetic islands 310. The reset head 330 (as well as reset head 335) is connected to an energy source (not shown) and comprises wires, coils, controls, etc., for generating the desired magnetic field, as understood by one skilled in the art.

The read/write head 325 is configured to align a plurality of moments M1 of the plurality of magnetic islands 310 to the same direction (i.e., orientation) such as up (0) or down (1). The read/write heads 325 is configured to write as a group to the plurality of magnetic islands 310 by heating (simultaneously, consecutively, and/or individually) the plurality of magnetic islands 310 to cause multiple (simultaneous, near simultaneous, and/or consecutive) spin-currents to change the direction of each of the plurality of moments M2. For example, the read/write head 325 can (rapidly) scan across the plurality of magnetic islands 310 so that all of the magnetic islands 310 are being heated and a thermal gradient flow is produced for each of the magnetic islands 310 (just as illustrated for magnetic island 310a); the thermal gradients for each magnetic island 310 produces corresponding spin-currents for each of the magnetic islands 310. Also, in one implementation the read/write head 325 may have multiple heat sources 320 which can each simultaneously heat (irradiate) a corresponding magnetic island 325.

Figure 5:
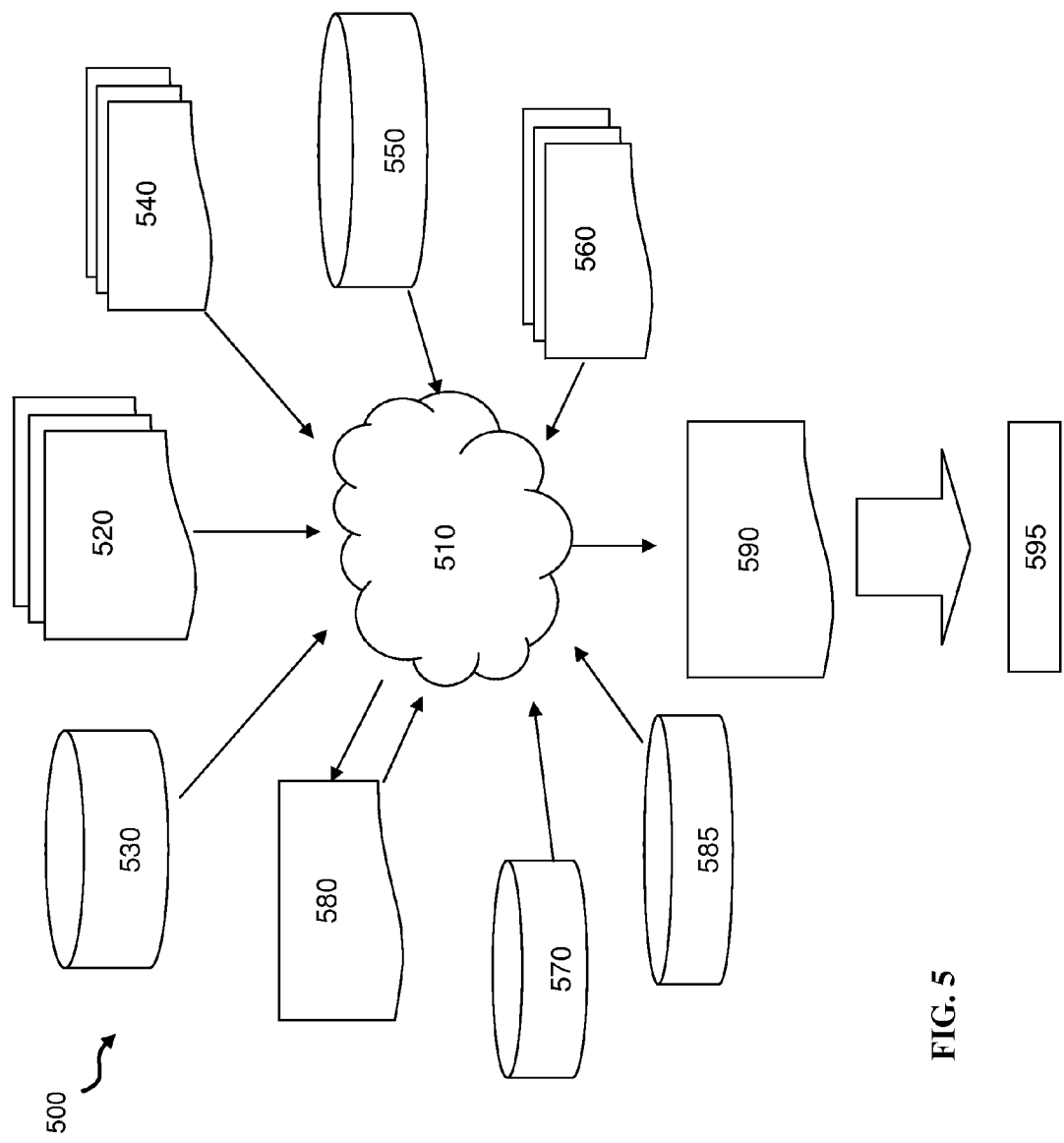
FIG. 5 shows a block diagram of an exemplary design flow which can be utilized in semiconductor IC logic design, simulation, test, layout, and/or manufacture.

FIG. 5 shows a block diagram of an exemplary design flow 500 used for example, in semiconductor IC logic design, simulation, test, layout, and manufacture. Design flow 500 includes processes, machines and/or mechanisms for processing design structures or devices to generate logically or otherwise functionally equivalent representations of the design structures and/or devices described above and shown in FIGS. 1-4. The design structures processed and/or generated by design flow 500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 500 may vary depending on the type of representation being designed. For example, a design flow 500 for building an application specific IC (ASIC) may differ from a design flow 500 for designing a standard component or from a design flow 500 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 520 that is preferably processed by a design process 510. Design structure 520 may be a logical simulation design structure generated and processed by design process 510 to produce a logically equivalent functional representation of a hardware device. Design structure 520 may also or alternatively comprise data and/or program instructions that when processed by design process 510, generate a functional representation of the physical structure of a hardware device. Whether representing functional and/or structural design features, design structure 520 may be generated using electronic computer-aided design (ECAD) such as implemented by a core developer/designer. When encoded on a machine-readable data transmission, gate array, or storage medium, design structure 520 may be accessed and processed by one or more hardware and/or software modules within design process 510 to simulate or otherwise functionally represent an electronic component, circuit, electronic or logic module, apparatus, device, or system such as those shown in FIGS. 1-4. As such, design structure 520 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 510 preferably employs and incorporates hardware and/or software modules for synthesizing, translating, or otherwise processing a design/simulation functional equivalent of the components, circuits, devices, or logic structures shown in FIGS. 1-4 to generate a netlist 580 which may contain design structures such as design structure 520. Netlist 580 may comprise, for example, compiled or otherwise processed data structures representing a list of wires, discrete components, logic gates, control circuits, I/O devices, models, etc. that describes the connections to other elements and circuits in an integrated circuit design. Netlist 580 may be synthesized using an iterative process in which netlist 580 is resynthesized one or more times depending on design specifications and parameters for the device. As with other design structure types described herein, netlist 580 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 510 may include hardware and software modules for processing a variety of input data structure types including netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information. Design process 510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510 without deviating from the scope and spirit of the invention. Design process 510 may also include modules for performing standard circuit design processes such as timing analysis, verification, design rule checking, place and route operations, etc. Design process 510 employs and incorporates logic and physical design tools such as HDL compilers and simulation model build tools to process design structure 520 together with some or all of the depicted supporting data structures along with any additional mechanical design or data (if applicable), to generate a second design structure 590. Design structure 590 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4. In one embodiment, design structure 590 may comprise a compiled, executable HDL simulation model that functionally simulates the devices shown in FIGS. 1-4.

Design structure 590 may also employ a data format used for the exchange of layout data of integrated circuits and/or symbolic data format (e.g. information stored in a GDSII (GDS2), GL1, OASIS, map files, or any other suitable format for storing such design data structures). Design structure 590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4. Design structure 590 may then proceed to a stage 595 where, for example, design structure 590: proceeds to tape-out, is released to manufacturing, is released to a mask house, is sent to another design house, is sent back to the customer, etc.

As will be appreciated by one skilled in the art, aspects of the present invention may be embodied as a system, method or computer program product. Accordingly, aspects of the present invention may take the form of an entirely hardware embodiment, a system level architecture design embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiments of the invention have been described, it will be understood that those skilled in the art, both now and in the future, may make various improvements and enhancements which fall within the scope of the claims which follow. These claims should be construed to maintain the proper protection for the invention first described.

What is claimed is:

1. An apparatus for noncontact writing, comprising:
a plurality of magnetic islands on a nonmagnetic layer;
a reference layer under the nonmagnetic layer; and
a write head comprising a heat source, the write head is configured to cause a spin-current to write a state to a magnetic island of the plurality of magnetic islands by moving the heat source to create a temperature gradient throughout the magnetic island and the reference layer.

2. The apparatus of claim 1, wherein the write head is configured to cause the spin-current to write the state to the magnetic island of the plurality of magnetic islands by moving the heat source to create the temperature gradient throughout the magnetic island and the reference layer comprises: the write head being configured to heat the magnetic island to cause the temperature gradient across the magnetic island, the nonmagnetic layer, and the reference layer; and
wherein the spin-current aligns the state of the magnetic island to be parallel to the reference layer.

3. The apparatus of claim 2, wherein a temperature of the magnetic island is greater than a temperature of the reference layer.

4. The apparatus of claim 1, wherein the state of the magnetic island is a one or zero; and
wherein the magnetic island is a magnetic bit.

5. The apparatus of claim 1, wherein the magnetic island has a first moment and the reference layer has a second moment;
wherein the spin-current induced in the reference layer causes the first moment to be parallel to the second moment; and
wherein the first moment corresponds to the state of the magnetic island.

6. The apparatus of claim 1, further comprising a reset head;
wherein when a plurality of moments of the plurality magnetic islands are written to be parallel to the second moment of the reference layer, the reset head is configured to flip the second moment of the reference layer to be antiparallel to the plurality of moments of the plurality of magnetic islands.

7. The apparatus of claim 6, wherein the reset head is configured to generate a magnetic field that flips the second moment of the reference layer; and
wherein a magnitude of the magnetic field that flips the second moment of the reference layer is not high enough to flip any of the plurality of moments of the plurality of magnetic islands.

8. The apparatus of claim 6, wherein the reset head is configured to generate a magnetic field that flips the second moment of the reference layer; and wherein a magnitude of the magnetic field that flips the second moment of the reference layer is also high enough to flip any of the plurality of moments of the plurality of magnetic islands.

9. The apparatus of claim 1, wherein the write head is configured to align a plurality of moments of the plurality of magnetic islands to a direction; and wherein when writing as a group to the plurality of magnetic islands, the write head is configured to heat the plurality of magnetic islands to cause respective spin-currents to change the direction of the plurality of moments.

10. The apparatus of claim 1, wherein the heat source is a near-field optical source that generates a near-field optical beam, in which the near-field optical beam can heat any of the plurality of magnetic islands.

11. The apparatus of claim 1, wherein the plurality of magnetic islands are physically separated structures; or wherein the plurality of magnetic islands are magnetic domains inside a continuous magnetic film in which the magnetic domains are suitable for sustaining a distinct and stable magnetic state.

12. A computer program product for noncontact writing, comprising a tangible storage medium readable by a processing circuit and storing instructions for execution by the processing circuit for performing a method comprising:

utilizing a plurality of magnetic islands on a nonmagnetic layer;

utilizing a reference layer under the nonmagnetic layer; and causing a spin-current to write a state to a magnetic island of the plurality of magnetic islands by moving a heat source to create a temperature gradient throughout the magnetic island and the reference layer.

13. The computer program product of claim 12, wherein causing the spin-current to write the state to the magnetic island of the plurality of magnetic islands by moving the heat source to create the temperature gradient throughout the magnetic island and the reference layer comprises: heating the magnetic island to cause the temperature gradient across the magnetic island, the nonmagnetic layer, and the reference layer; and wherein the spin-current writes the state of the magnetic island to be parallel to a moment or magnetization of the reference layer.

14. A method for noncontact writing of a magnetic bit, comprising:

providing a plurality of magnetic islands on a nonmagnetic layer;

providing a reference layer under the nonmagnetic layer; and causing a spin-current to write a state to a magnetic island of the plurality of magnetic islands by moving a heat source to create a temperature gradient throughout the magnetic island and the reference layer.

15. The method of claim 14, wherein causing the spin-current to write the state to the magnetic island of the plurality of magnetic islands by moving the heat source to create the temperature gradient throughout the magnetic island and the reference layer comprises: heating the magnetic island to cause the temperature gradient across the magnetic island, the nonmagnetic layer, and the reference layer; and wherein at least one of: the spin-current writes the state of the magnetic island to be parallel to a moment or magnetization orientation of the reference layer, and the spin-current writes the state of the magnetic island to be antiparallel to the moment or magnetization orientation of the reference layer.

16. The method of claim 15, wherein a temperature of the magnetic island is greater than a temperature of the reference layer as a result of the temperature gradient.

17. The method of claim 14, wherein the state of the magnetic island is a one or zero; and wherein the magnetic island is a magnetic bit.

18. The method of claim 14, wherein the magnetic island has a first moment and the reference layer has a second moment;

wherein the spin-current induced in the reference layer causes the first moment to be parallel to the second moment; and wherein the first moment corresponds to the state of the magnetic island.

19. The method of claim 14, further comprising when a plurality of moments of the plurality magnetic islands are written to be parallel to the second moment of the reference layer, flipping the second moment of the reference layer to be antiparallel to the plurality of moments of the plurality of magnetic islands.

20. The method of claim 19, wherein flipping the second moment of the reference layer to be antiparallel to the plurality of moments of the plurality of magnetic islands comprises a reset head generating a magnetic field that flips the second moment of the reference layer; and wherein a magnitude of the magnetic field that flips the second moment of the reference layer is not high enough to flip any of the plurality of moments of the plurality of magnetic islands.

21. The method of claim 19, wherein flipping the second moment of the reference layer to be antiparallel to the plurality of moments of the plurality of magnetic islands comprises a reset head generating a magnetic field that flips the second moment of the reference layer; and wherein a magnitude of the magnetic field that flips the second moment of the reference layer is sufficient to also flip any of the plurality of moments of the plurality of magnetic islands.

22. The method of claim 14, further comprising aligning a plurality of moments of the plurality of magnetic islands to a direction; and writing as a group to the plurality of magnetic islands by heating the plurality of magnetic islands to cause respective spin-currents to change the direction of the plurality of moments to an opposite direction.

23. The method of claim 14, wherein the heat source is a near-field optical source that generates a near-field optical beam, in which the near-field optical beam can heat any of the plurality of magnetic islands.

24. The method of claim 14, wherein the plurality of magnetic islands are physically separated structures; or wherein the plurality of magnetic islands are magnetic domains inside a continuous magnetic film in which the magnetic domains are suitable for sustaining a distinct and stable magnetic state.

* * * * *